(12) United States Patent
Myers et al.

(10) Patent No.: US 9,720,434 B2
(45) Date of Patent: Aug. 1, 2017

(54) POWER GATING IN AN ELECTRONIC DEVICE

(71) Applicant: ARM Limited, Cambridge (GB)

(72) Inventors: James Edward Myers, Cambridge (GB); David Walter Flynn, Cambridge (GB); David William Howard, Cambridge (GB)

(73) Assignee: ARM Limited, Cambridge (GB)

( * ) Notice: Subject to any disclaimer, the term of this patent is extended or adjusted under 35 U.S.C. 154(b) by 139 days.

(21) Appl. No.: 14/731,250

(22) Filed: Jun. 4, 2015

(65) Prior Publication Data
US 2015/0355662 A1 Dec. 10, 2015

(30) Foreign Application Priority Data
Jun. 5, 2014 (GB) .................................. 1409983.2

(51) Int. Cl.
| | | |
|---|---|---|
| *H03K 19/0175* | (2006.01) | |
| *G05F 3/08* | (2006.01) | |
| *G06F 17/50* | (2006.01) | |
| *G06F 1/32* | (2006.01) | |
| *H03K 19/00* | (2006.01) | |

(52) U.S. Cl.
CPC .............. *G05F 3/08* (2013.01); *G06F 1/3287* (2013.01); *G06F 17/5068* (2013.01); *H03K 19/0016* (2013.01)

(58) Field of Classification Search
CPC ......... H03K 19/00315; H03K 19/0175; H03K 19/0185; H03K 19/018507; H03K 19/018521

USPC ........................... 326/63, 68, 80–81; 327/333
See application file for complete search history.

(56) References Cited

U.S. PATENT DOCUMENTS

| | | | | |
|---|---|---|---|---|
| 7,737,720 B2 * | 6/2010 | Idgunji | .............. | H03K 19/0016 326/102 |
| 7,786,793 B2 * | 8/2010 | Ogata | ........................ | G06F 1/32 327/530 |
| 7,982,498 B1 * | 7/2011 | Chen | .................. | H03K 3/35613 326/21 |
| 8,013,628 B2 * | 9/2011 | Lee | ........................ | H04B 15/02 326/21 |

(Continued)

OTHER PUBLICATIONS

UKIPO Search Report; GB 1409983.2; Nov. 13, 2014.
(Continued)

*Primary Examiner* — Jason M Crawford
(74) *Attorney, Agent, or Firm* — Pramudji Law Group PLLC; Ari Pramudji

(57) ABSTRACT

An electronic device 2 has circuitry 4 which operates in a first voltage domain 6 supplied with a first voltage level VDD1 and a reference voltage level. A voltage regulator 14 generates the first voltage level VDD1 from a second voltage level VDD2 higher than the first voltage level VDD1. At least one power gate 20, 30 is provided for selectively coupling the circuitry 4 to one of the first voltage level VDD1 or the reference level. The control signal 22 for the power gate 20, 30 is generated in a second voltage domain supplied with a higher voltage level VDD2 or VDD3 derived from the second voltage level VDD2 supplied to the voltage regulator 14. Hence, an existing high voltage source within the device 2 can be reused for applying a boosted voltage to power gates to improve efficiency of power gating.

20 Claims, 4 Drawing Sheets

(56) References Cited

U.S. PATENT DOCUMENTS

| | | | | |
|---|---|---|---|---|
| 2006/0164147 A1* | 7/2006 | Nomura | ......... | H03K 19/018521<br>327/333 |
| 2010/0118022 A1* | 5/2010 | Kim | ......... | G09G 3/20<br>345/213 |
| 2011/0063012 A1* | 3/2011 | Chan | ......... | H03K 3/356113<br>327/333 |
| 2011/0181343 A1 | 7/2011 | Myers et al. | | |
| 2012/0126879 A1* | 5/2012 | Sandhu | ......... | H03K 17/145<br>327/427 |
| 2012/0187998 A1* | 7/2012 | Jarrar | ......... | H03K 19/01852<br>327/333 |
| 2012/0326772 A1* | 12/2012 | Myers | ......... | H03K 19/0016<br>327/543 |
| 2013/0027123 A1* | 1/2013 | Idgunji | ......... | H03K 19/0016<br>327/543 |
| 2013/0173938 A1 | 7/2013 | Yang | | |
| 2014/0006808 A1 | 1/2014 | Sizikov et al. | | |
| 2014/0361823 A1* | 12/2014 | Lundberg | ......... | H03K 19/0008<br>327/309 |

OTHER PUBLICATIONS

Konijnenburg, et al.; Reliable and Energy-Efficient 1MHz 0.4V Dynamically Reconfigurable SoC for ExG Applications in 40nm LP CMOS; 2013 IEEE International Solid-State Circuits Conference; Paper 24.6; Feb. 2013.

Bol, et al; SleepWalker: A 25-MHz 0.4-V Sub-mm2 7-μW/MHz Microcontroller in 65-nm LP/GP CMOS for Low-Carbon Wireless Sensor Nodes; IEEE Journal of Solid-State Circuits; vol. 48, No. 1; Jan. 2013.

Inukai, et al; Boosted Gate MOS (BGMOS): Device/Circuit Cooperation Scheme to Achieve Leakage-Free Giga-Scale Integration; IEEE Custom Integrated Circuits Conference; 2000.

* cited by examiner

POWER GATING IN AN ELECTRONIC DEVICE

The present technique relates to the field of electronic devices. More particularly, the technique relates to power gating.

Power gating is a known technique for reducing leakage power in electronic devices. A power gate can be coupled between a circuit and its voltage supply to selectively couple the circuit to the voltage supply, or isolate the circuit from the voltage supply to reduce power consumption. Ideally, when the power gate is on to allow the voltage to be supplied to the circuit then it would have an effectively infinite current passing through the power gate, and when it is off to isolate the circuit from the voltage supply it would have zero current passing through it. The currents passed by the power gate in the "on" state and the "off" state are referred to as "I-on" and "I-off" below. In practice, power gates have a non-infinite I-on because there is some IR drop across the power gate, reducing the amount of power that can be supplied by power gate, and a non-zero I-off so that there is some leakage when the circuit is powered down, which increases energy consumption. Therefore, there is a design challenge: to have enough power gates to supply the worst case functional power required by the circuit without causing too much IR drop, and have as few as possible power gates to minimise leakage in the shutdown mode. As electronic devices are becoming smaller and smaller, they are tending to use lower voltages and this is making the design challenge for power gating significantly harder because when operating at near-threshold or sub-threshold voltages, I-on tends towards I-off. The reduced ratio between the I-on and I-off means that circuit performance is very sensitive to voltage, and any extra IR drop significantly impacts the circuit in terms of performance and energy efficiency. The present technique seeks to address these problems.

Viewed from one aspect, the present technique provides an electronic device comprising:

circuitry configured to operate in a first voltage domain supplied with a first voltage level and a reference voltage level;

a voltage regulator configured to generate the first voltage level from a second voltage level higher than the first voltage level;

at least one power gate configured to selectively couple the circuitry to one of the first voltage level generated by the voltage regulator and the reference voltage level; and control circuitry configured to generate a gating control signal for controlling whether the at least one power gate couples the circuitry to, or isolates the circuitry from, said one of the first voltage level and the reference voltage level;

wherein the control circuitry is configured to operate in a second voltage domain supplied with a third voltage level derived from the second voltage level, wherein the third voltage level is higher than the first voltage level; and the at least one power gate has a gate terminal configured to receive the gating control signal generated by the control circuitry in the second voltage domain.

An electronic device has circuitry which operates in a first voltage domain supplied with a first voltage level and a reference voltage level. The circuitry may be any functional component of the electronic device, such as a processor, memory, bus logic, or radio unit, for example. At least one power gate is provided to selectively couple the circuitry to one of the first voltage level and the reference voltage level. However, the control signal applied to the gate terminal of the power gate, which controls whether the power gate couples the circuitry to the first/reference voltage level or isolates the circuitry from the first/reference voltage level, is generated in a second voltage domain supplied with a higher voltage level than the first voltage level. By boosting the gate voltage of the power gate relative to the first voltage level used by the circuitry itself, an increased I-on to I-off ratio can be achieved because, depending on the type of power gate, driving the gate terminal of the power gate more strongly either reduces I-off (super cutoff) or increases I-on (boosted gates), which helps to improve the performance and energy efficiency of the device.

Boosted gate operation of a power gate is a known technique, but it is not often used because it is generally considered expensive to source the higher voltage used to drive the gate terminal of the power gate. For example, a charge pump may be used, but this incurs additional area and energy overhead. In contrast, the inventors of the present technique recognised that in many electronic devices there is already a source of a voltage level which is higher than the first voltage level used to power the circuitry itself. For example, in many embedded devices, wireless sensor nodes, and other relatively small electronic devices, a relatively high second voltage level may be supplied to the electronic device, but to save power this may be reduced to the first voltage level to power the circuitry, so that the circuitry consumes less dynamic power. Hence, many devices have a voltage regulator to convert the second voltage level into the first voltage level to be supplied to the circuitry.

Therefore, the control circuitry for the power gates may operate in a second voltage domain which is supplied with a third voltage level which is derived from the second voltage level and is higher than the first voltage level, and the control signal for the power gates may be generated in the second voltage domain. Therefore, the boosted gate operation for the power gates may reuse the higher voltage already provided in the system, and so it is not necessary to provide an additional voltage generator such as a charge pump for generating the boosted gate voltage, saving energy and circuit area.

The electronic device may have an energy source which generates the second voltage level. The energy source could be a non-local energy source which is not provided within the electronic device. However, in other cases the energy source may be a local energy source provided within the electronic device. Often, when a local energy source is provided, it will generate a higher voltage than is actually used by the circuitry within the device, so this higher voltage can be used to generate the boosted control signal for the gate terminal of the power gates.

For example, the energy source may include at least one battery. When a battery is provided, it is common for the battery to generate a relatively high voltage, but it may not be energy efficient to operate the circuitry at this voltage, and so a regulator is usually provided for converting the voltage to a lower supply voltage for the circuitry. For example, a typical coin cell battery may generate a voltage such as 1.2V to 3.3V, but a processor or other circuitry may only operate at 1V or less. Hence, in many small battery-powered electronic devices, the higher voltage which is already natively available from the battery can be used to derive the control signal for the power gates to operate the power gates in a boosted gate or super cutoff mode.

Another example of an energy source may be an energy harvester which harvests ambient energy, such as a photovoltaic cell for harvesting energy from ambient light, a thermoelectric harvester which harvests energy from ambient temperature differences or temperature gradients, a piezoelectric harvester which harvests energy from mechanical or acoustical vibration, or a radio energy harvester which harvests energy from ambient radio waves.

The power gates may in some embodiments include footer transistors which selectively couple the circuitry in to the reference voltage level. Footer transistors are typically implemented using n-type transistors and so applying a boosted voltage to the gate of the footer transistor increases I-on during the "on" state when the footer supplies the circuitry with the reference voltage level. The present technique is particularly useful for footer power gates, because I-on typically drops much faster with reducing voltage than I-off, so applying a boosted gate voltage to a footer transistor more strongly increases the I-on/I-off ratio for the power gate than an equivalent boost to the gate terminal of a header transistor.

Nevertheless, the present technique may also be applied to header transistors for selectively coupling the circuitry to the first voltage level supplied by the voltage regulator. Header transistors are typically implemented using p-type transistors, so applying a boosted voltage to the gate terminal of the header transistor puts the header in a super cutoff mode to reduce I-off (leakage current) and save energy. Reducing I-off increases the I-on/I-off ratio, so that less energy is leaked through the power gate during a sleep or power saving mode. In some implementations, providing header power gates instead of footers may result in a lower circuit area.

It is also possible to provide a combination of header and footer transistors in the same device.

The transistors used for the power gates may be more voltage tolerant than the transistors used in the circuitry itself. That is, the power gates may be more resistant to damage, and capable of withstanding a higher applied voltage, than the transistors in the processing circuitry. This is useful to reduce the risk of damage to the power gates caused by the higher voltage used for the control signal. For example, the power gates may be made of a different transistor technology which is more voltage resistant. For example, multi-gate transistors such as FinFETs may be used.

Also, the power gates can be made more voltage tolerant by providing a thicker gate oxide than the oxide used in transistors of the circuitry. Thick gate oxide transistors are useful for two reasons: not only are they more voltage resistant, but thick gate oxide transistors also have a better I-on/I-off ratio at low operating voltages than thin gate oxide transistors. Therefore, the reliability, performance and energy efficiency of the electronic device may be improved by using thick gate oxide transistors.

Similarly, the control circuitry for controlling whether the power gates are on or off may be formed of more voltage tolerant transistors, such as thick gate oxide transistors, to improve performance, reduce leakage and reduce the risk of damage when powered by the higher voltage.

The third voltage level of the second voltage domain may be derived from the second voltage level in different ways. In many cases, the third voltage level may be the same as the second voltage level so that the voltage provided by the energy source is provided directly to the control circuitry and used to generate the control signal for the power gate. In other examples, the third voltage level may be lower than the second voltage level but higher than the first voltage level. For example, a further voltage regulator may be provided which generates the third voltage level from the second voltage level and supplies it to the control circuitry. This may be useful if the energy source generates a higher voltage than can be withstood by the control circuitry or the power gates, for example.

As well as controlling the state of the power gates, the control circuitry may also control whether the voltage regulator is in an active state in which the regulator generates the first voltage level from the second voltage level, or a power saving state in which the voltage regulator stops generating the first voltage level.

In conventional devices, the first voltage level generated by the regulator would be used to generate the control signals for the power gates and so the voltage regulator would have to be active before control signals for the power gates can be generated. This means that when switching the voltage regulator between the power saving state and the active state, there may be glitches in the voltage supplied by the power gates because turning the regulator on or off may also turn on or off the power gates. This can be undesirable because significant glitching energy can be consumed when powering up a supply rail or other circuit.

In contrast, when the control signal for the power gates is generated in the second voltage domain as in the present technique, the generation of the control signal may be completely independent from the first voltage level generated by the voltage regulator, and so when switching the voltage regulator between the power saving state and the active state, the power gates may remain in a state in which the circuitry is isolated from the first/reference voltage level. Hence, even as the regulator is switching states, there is no energy lost through glitching. By reducing the energy cost associated with transitions between the active state and the power saving state, this reduces the length of time which the voltage regulator would have to remain in the power saving state to compensate for the energy consumed when switching the voltage regulator to and from the power saving state, allowing the power saving state of the regulator to be used more frequently (during shorter intervals of rest) than in the known systems, to reduce the total power consumption.

The regulator may be a linear regulator, switching regulator or any other type of regulator which can generate a reduced voltage level from a higher voltage level.

The control circuitry may not be local to the power gates. For example, in an integrated circuit the power gates may be distributed across the circuit and so there may need to be some routing of the control signal from the control circuitry to the power gates. Therefore, at least one buffer may be provided to propagate the control signal from the control circuitry to the power gate. The buffer may be an inverter or a non-inverting buffer, and may be formed of more voltage tolerant transistors (e.g. thick gate oxide transistors) as discussed above for the control circuitry and power gates. The buffer may act as a repeater so that even if there are losses as the control signal is propagated across the circuit then the control signal can be regenerated at each buffer so that it is strong enough when it reaches the power gate to be able to switch the power gate. The buffers may be supplied with the third voltage level from the second voltage domain, so that the buffers can repeat the control signal at the boosted (third) voltage level to be supplied to the gate of the power gates.

Some systems may have multiple voltage domains with circuitry operating at different voltage levels. Each such domain may correspond to the "first voltage domain" described below and each of these domains may have power gates which are controlled by the boosted gating control signal from the second voltage domain associated with the control circuitry.

Also, within a same domain, different power gates may be controlled by different gating control signals which can independently turn on and off different groups of power gates. For example, different functional units or parts of a circuit may be turned on and off independently using different blocks of power gates. Also, within the same part of a circuit or the same functional unit, it may be desirable to stagger turning on different power gates to the same functional unit to reduce the peak inrush current which flows when the functional unit is turned on, since a large inrush current can cause voltages in other parts of the integrated circuit to drop potentially causing errors. For example, buffers for routing a control signal to different parts of the circuit may be daisy chained so that the control signal arrives at different power gates at different times, to stagger the switch on. Hence, there may be a number of different gating control signals for different power gates, each of which may be generated from the second voltage domain at the higher third voltage than the first voltage used in the first voltage domain.

While power gates are described in this application as being "on" or "off", it will be appreciated that in the on state there will be a non-infinite current flowing through the power gate and in the off state there will be a finite non-zero current.

Viewed from another aspect, the present technique provides an electronic device comprising:

circuit means for operating in a first voltage domain supplied with a first voltage level and a reference voltage level;

voltage regulating means for generating the first voltage level from a second voltage level higher than the first voltage level;

at least one power gating means for selectively coupling the circuit means to one of the first voltage level generated by the voltage regulating means and the reference voltage level; and control means for generating a gating control signal for controlling whether the at least one power gating means couples the circuit means to, or isolates the circuit means from, said one of the first voltage level and the reference voltage level;

wherein the control means is configured to operate in a second voltage domain supplied with a third voltage level derived from the second voltage level, wherein the third voltage level is higher than the first voltage level; and the at least one power gating means has a gate terminal means for receiving the gating control signal generated by the control means in the second voltage domain.

Viewed from a further aspect, the present technique provides a power control method for an electronic device comprising circuitry configured to operate in a first voltage domain supplied with a first voltage level and a reference voltage level and at least one power gate configured to selectively couple the circuitry to one of the first voltage level and the reference voltage level; the method comprising:

generating the first voltage level from a second voltage level higher than the first voltage level using a voltage regulator;

generating a gating control signal for controlling whether the at least one power gate couples the circuitry to, or isolates the circuitry from, said one of the first voltage level and the reference voltage level, wherein the gating control signal is generated in a second voltage domain supplied with a third voltage level derived from the second voltage level, wherein the third voltage level is higher than the first voltage level; and supplying the gating control signal to a gate terminal of the gating control signal.

Viewed from another aspect, the present technique provides a computer-implemented method of designing an integrated circuit layout for an electronic device, the method comprising using an automated design tool to generate data defining the integrated circuit layout, the integrated circuit layout comprising:

circuitry configured to operate in a first voltage domain supplied with a first voltage level and a reference voltage level;

a voltage regulator configured to generate the first voltage level from a second voltage level higher than the first voltage level;

at least one power gate configured to selectively couple the circuitry to one of the first voltage level generated by the voltage regulator and the reference voltage level; and control circuitry configured to generate a gating control signal for controlling whether the at least one power gate couples the circuitry to, or isolates the circuitry from, said one of the first voltage level and the reference voltage level;

wherein the control circuitry is configured to operate in a second voltage domain supplied with a third voltage level derived from the second voltage level, wherein the third voltage level is higher than the first voltage level; and the at least one power gate has a gate terminal configured to receive the gating control signal generated by the control circuitry in the second voltage domain.

Automated design tools may be used to design an electronic device according to the present technique. For example, electronic design automation (EDA) tools may use a cell library defining a set of standard cells available for selection for inclusion in an integrated circuit layout. Cells may be included corresponding to the power gates, buffers, and control circuitry described above, which operate using the higher voltage. For example, thick gate oxide transistors may be defined for these cells. The generated data defining the integrated circuit layout can be used to control fabrication of the integrated circuit having the designed layout.

Further aspects, features and advantages of the present technique will be apparent from the following description which is to be read in conjunction with the accompanying drawings, in which.

Figure 4:
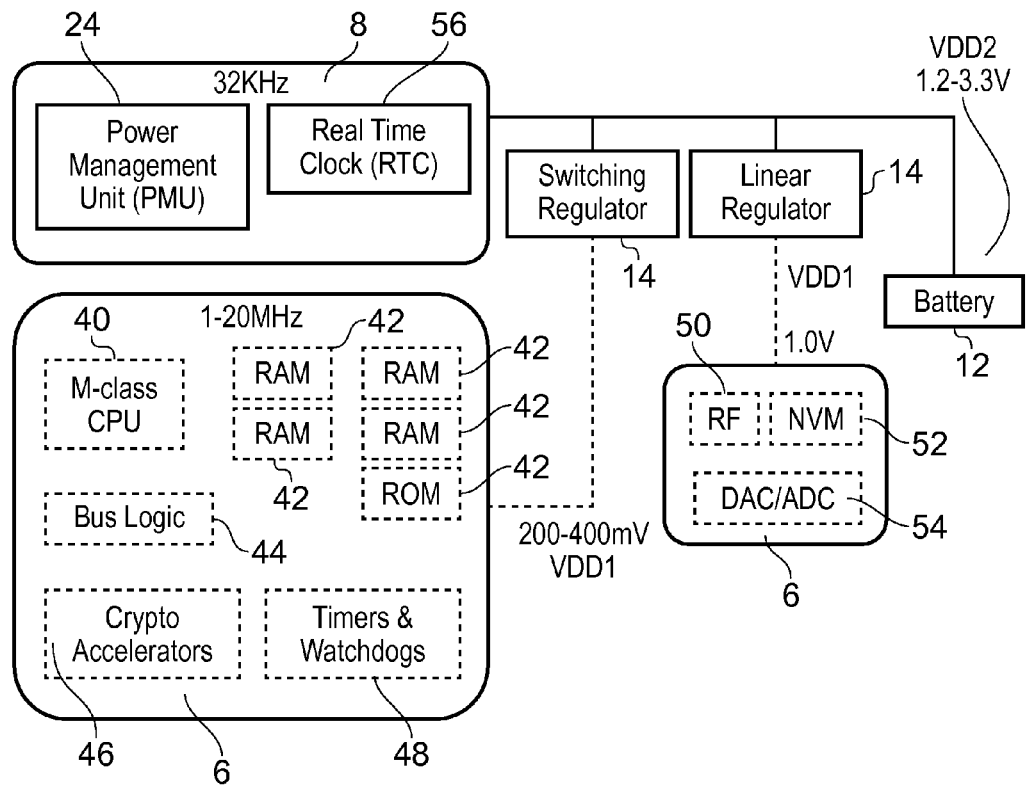
Figure 5:
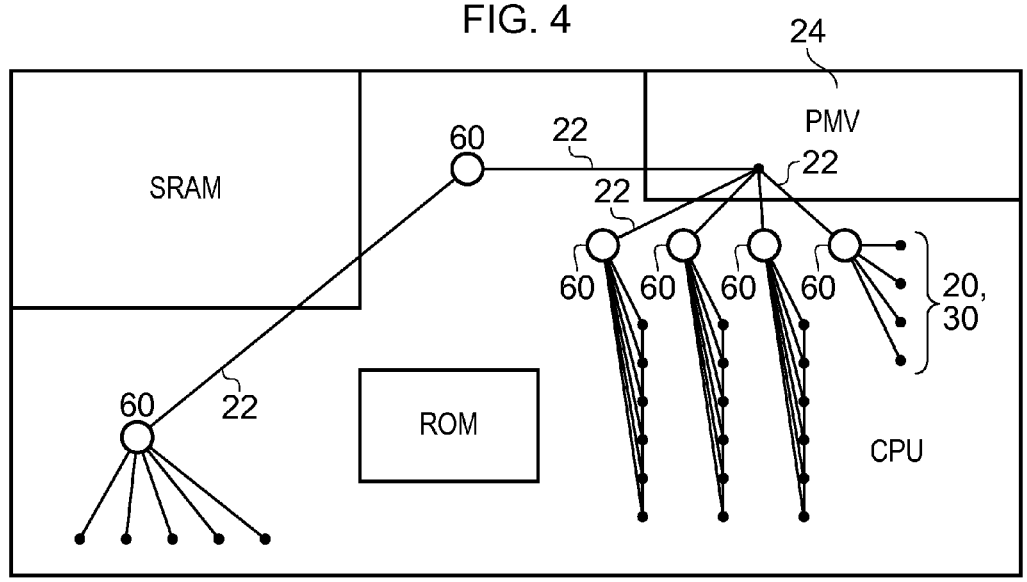
Figure 6:
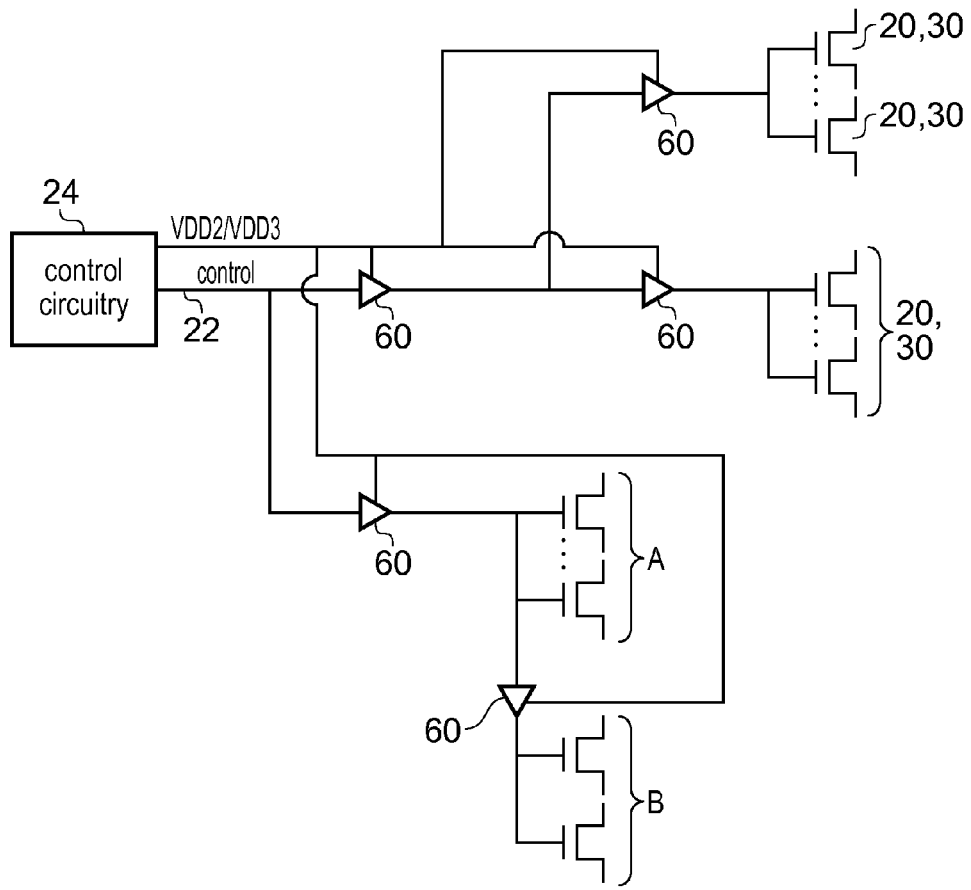
Figure 7:
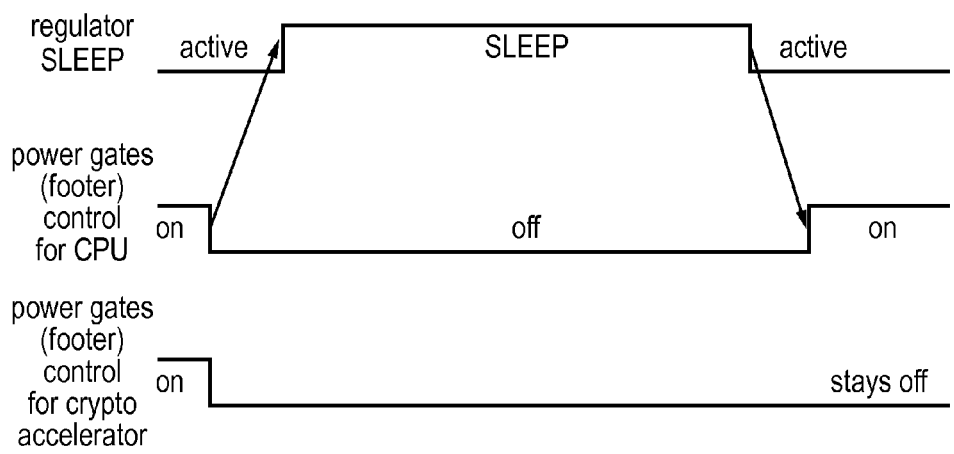

FIG. 4 schematically illustrates some functional components of an electronic device according to one example;

FIG. 5 illustrates an example of a circuit floor plan for an electronic device according to the present technique;

FIG. 6 illustrates an example of buffers for routing a control signal and a voltage level from the control circuitry to the power gates; and FIG. 7 illustrates an example of controlling the on/off states of power gates independently from the on/off state of a voltage regulator.

Figure 1:
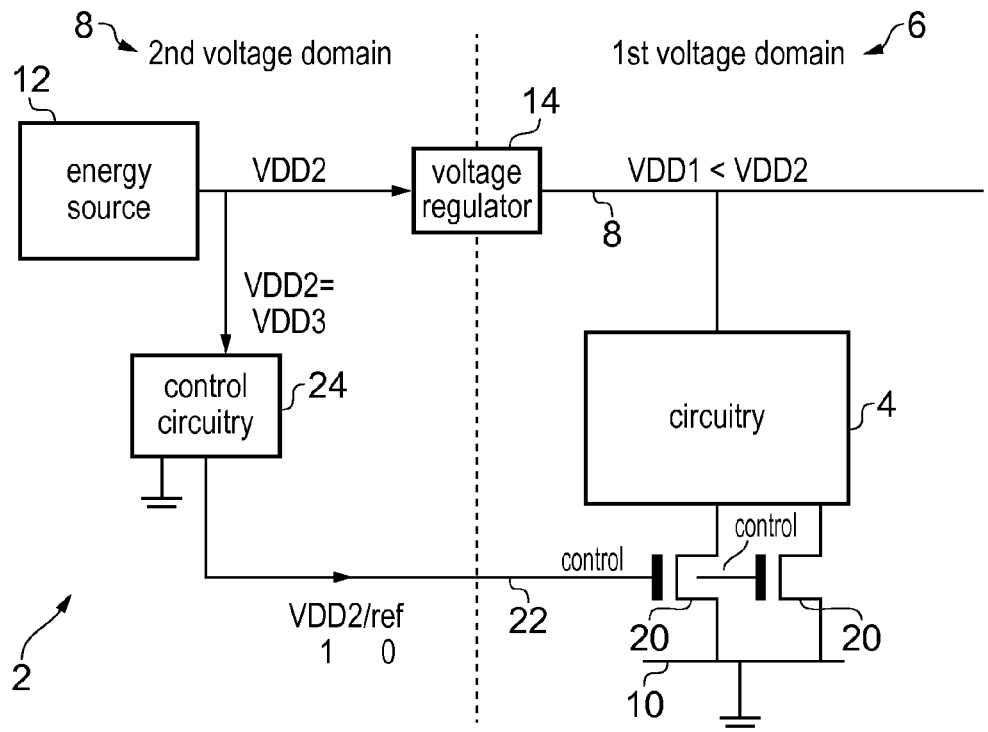
FIG. 1 illustrates an example of controlling footer power gates in an electronic device.

FIG. 1 illustrates an electronic device 2 having circuitry 4, which may be a processor, memory, radio unit, bus controller, or any other component of the device 2. The circuitry 4 is in a first voltage domain which receives a first voltage level VDD1 from a first power rail 8 and a reference voltage level (ground) from a reference power rail 10. The device 2 has an energy source 12 which generates a second voltage level VDD2 which is higher than the first voltage level VDD1. A voltage regulator 14 is provided for converting the second voltage level VDD2 into the first voltage level VDD1 on the supply rail 8 for the circuitry 4. For example, the energy source 12 may be a battery, such as a coin cell battery generating a voltage level of 3.3 volts, say. The energy source 12 could also be an energy harvester which captures ambient energy from the vicinity of the device 2 and powers the circuitry 4 based on the harvested energy. For example, the energy harvester may be a solar cell, RF energy harvester, piezoelectric device or thermoelectric devices. The energy harvester may have a storage device such as a battery or supercapacitor which can be charged with energy when the harvester collects excess energy not required by the circuitry 4, and can power the circuitry 4 when there is insufficient energy from the harvester. With the energy harvester, the second voltage level VDD2 may be variable as it may depend on the ambient energy available (e.g. amount of light). In other examples, the energy source 12 may be a pin which receives the second voltage level VDD2 from an external voltage generator.

The reference voltage level on rail 10 may be any voltage level which is lower than the first voltage level VDD1 on rail 8. For example, the reference voltage level may be a ground voltage level, which in some embodiments may be 0 V or an earthed voltage level, but in other voltages could be another arbitrary voltage level which is lower than VDD1. The reference voltage level may act as a digital ground for the circuitry 4 for example.

The circuitry 4 has power gates 20, which in this embodiment are footer transistors 20 coupled between the reference supply rail 10 and the circuitry 4. The footer transistors 20 are NMOS transistors which selectively couple the circuitry 4 to the reference voltage level or isolate the circuitry 4 from the voltage level, under control of a control signal 22 generated by control circuitry 24. The control circuitry 24 operates in a second voltage domain 8 corresponding to the second voltage level VDD2 generated by the energy source 12. The control circuitry 24 can place the circuitry 4 in a power saving state by setting the control signal to 0 (the reference voltage level) to turn off the footer transistors 20 and isolate the circuitry 4 from the reference voltage supply 10. Also, the control circuitry places the circuitry 4 in an active state by setting the control signal to 1 (VDD2) to turn on the footer transistors 20, allowing the reference voltage to be supplied to the circuitry 4. By generating the gating control signal 22 in the second voltage domain 8 rather than in the first voltage domain, the gates of the footer transistors 20 are driven more strongly and so the I-on current passing through the footers 20 when switched on is greater than would be the case if the control signal 22 was generated from the first voltage level VDD1 in the first voltage domain 6. This means that performance is improved since there is less resistive loss across the power gating transistors 20. Unlike known techniques which use boosted gate operation of power gates, there is no need to provide an additional voltage generator to generate the boosted gate voltage, since many electronic devices 2 which operate at relatively low voltages, for which power saving is important, already have a higher voltage VDD2 present within the system since the energy source 12 typically generates a higher voltage VDD2 but for power saving the voltage is reduced for the circuitry 4 using the voltage regulator 14. Therefore, the boosted gate mode of operation for the power gates can be implemented with very little additional circuitry and an additional voltage generator such as a charge pump is not required.

Figure 2:
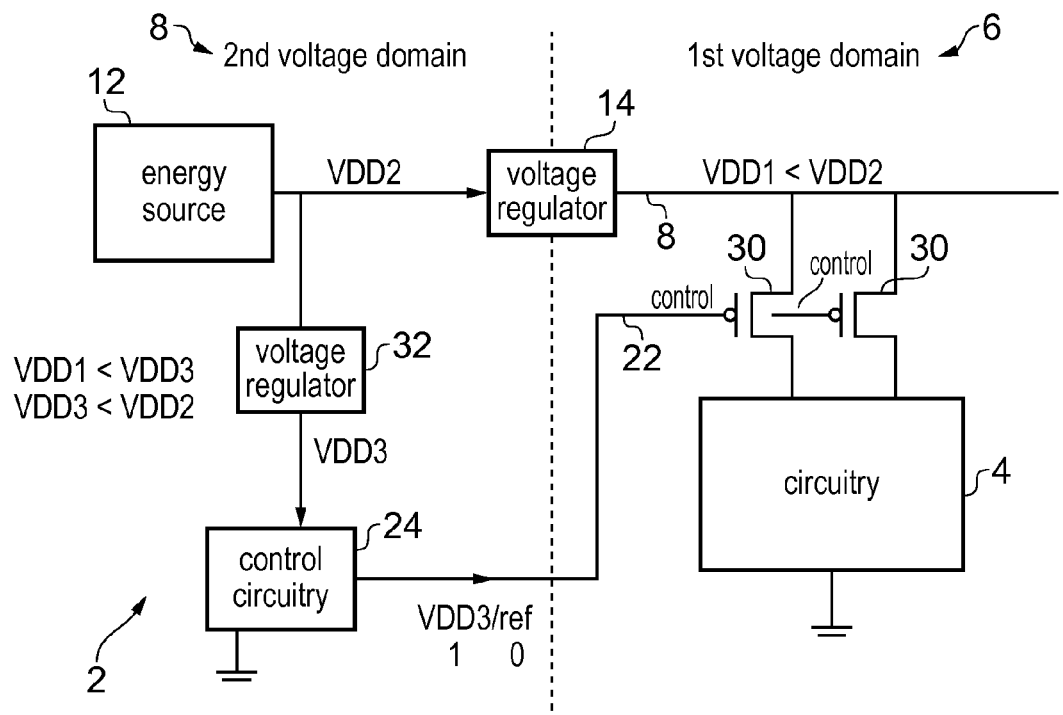
FIG. 2 shows an example of controlling header power gates in an electronic device.

FIG. 2 shows a second example of the electronic device 2, in which elements which are the same as in FIG. 1 are shown with the same reference numerals. FIG. 2 differs from FIG. 1 in that the power gating transistors in this example are header transistors 30 coupled between the VDD1 supply rail 8 and the circuitry 4. The header transistors 30 are PMOS transistors which turn on when the control signal is 0 (reference voltage level) to supply the first voltage level VDD1 to the circuitry 4, and turn off when the control signal 22 is 1 (VDD2) to isolate the circuitry from the supply rail 8.

FIG. 2 also differs from FIG. 1 in that the control circuitry 24 operates in the second voltage domain 8 at a level VDD3 which is different to the second voltage level VDD2 generated by the energy source 12. A further voltage regulator 32 is provided to convert the second voltage level VDD2 into the third voltage VDD3, which is lower than the second voltage level VDD2 and higher than the first voltage level VDD1. For example, this approach may be useful if the energy source 12 generates a higher voltage level than can be handled by the control circuitry 26 or than is desired to be handled for energy saving reasons, or if a more stable voltage is needed by the control circuitry 24. In FIG. 2 since VDD3 applied to the gate of the power gating transistors 30 during the "off" state of the headers 30 is larger than VDD1, then the headers operate in super cutoff mode so that I-off is reduced. This reduces the amount of leakage and improves the energy efficiency when the circuitry 4 is in power saving state.

It will be appreciated that the further voltage regulator 32 in FIG. 2 could also be provided in the example of FIG. 1 using footer transistors 20. Similarly, when using header transistors 30 as shown in FIG. 2 then the voltage regulator 32 could be omitted so that the control circuitry 26 operates at VDD2 in the same way as in FIG. 1.

Also, it will be appreciated that in general an electronic device 2 may have a number of different circuits 4 which operate in different voltage domains. A number of voltage regulators 14 can be provided for each domain to generate different levels VDD1 for each portion of the circuitry and the power gates for each of these domains may be controlled using the higher voltage from the second voltage domain 8. Also, it will be appreciated that in some embodiments not all the power gates within the same domain need to receive the same control signal. It is possible to selectively turn on or off different portions of the circuitry 4 by turning on or off the corresponding power gates while leaving other parts of the circuitry 4 active. That is, within the same voltage domain, there may be several power domains, with each power domain including a number of power gates controlled by a control signal, and different power domains receiving different control signals to allow for independent powering on/off of each power domain.

Further information about boosted gate mode of operation of power gating transistors can be found in the commonly assigned US patent application US 2011/0181343, the contents of which are entirely incorporated herein by reference.

Figure 3:
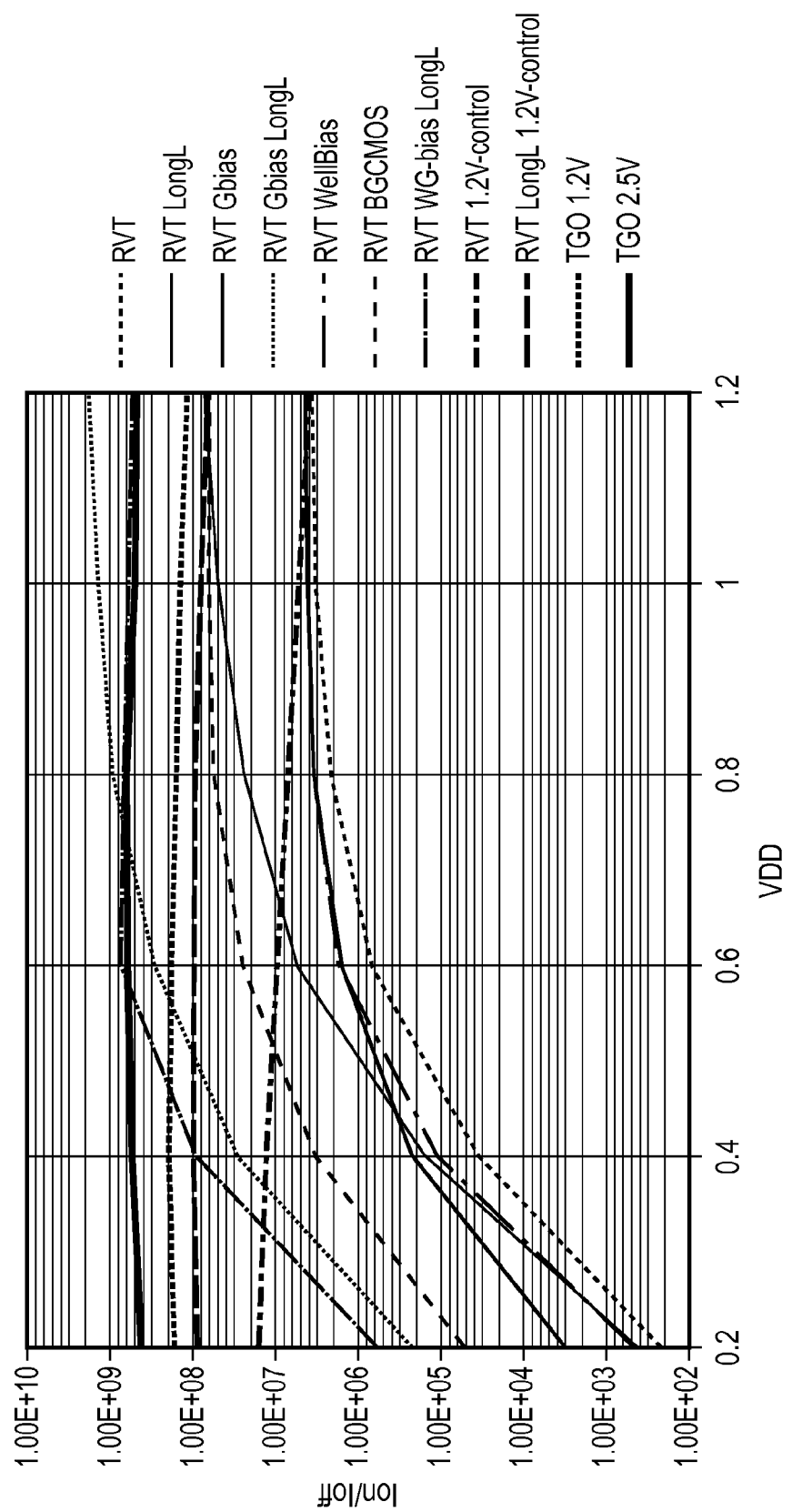
FIG. 3 shows a graph illustrating variation in I-on/I-off for different types of transistors at different voltages.

FIG. 3 is a graph showing the on/off current ratio for different types of transistor as they scale with operating voltage VDD. FIG. 3 shows I-on/I-off vs VDD for a range of footer power gates (different threshold voltages and lengths, different well or gate biases, etc.), as simulated in HSPICE. While I-on/I-off for almost all configurations nose-dives below about 0.4V, four of the lines are nearly flat. These are footers with the gate connected to 1.2 or 2.5V when enabled, rather than the local low voltage (i.e. boosted gate mode of operation). Of these, the thick-oxide (TGO) devices are 10× better than the thin-oxide devices. Therefore, as shown in FIG. 1 for example, thick gate oxide devices can be used as the footer power gates for sub/near threshold circuits, with >1V "sleepn" input, as with current technologies these should have the best trade-off between unimpeded system performance and lowest standby power (see the thick lines illustrating the gates of the footers 20 in FIG. 1).

More generally, in future other types of transistor may be developed which similarly have a relatively flat I-on to I-off ratio as the voltage decreases as shown in FIG. 3, and so such technologies could also be used. For example, the power gates may be formed using multigate devices (e.g. FinFETs) or gate all-around (GAA) transistors (e.g. horizontal nanowires or vertical nanowires or transistors made from carbon nanotubes or germanium rather than silicon). In general, the power gates 20, 30 and the control circuitry 24 may be constructed from transistors which are more voltage tolerant than the transistors used for the circuitry 4 itself. This is useful since a higher gate voltage is applied to these transistors and so to prevent breakdown or damage more voltage tolerant transistors, such as transistors having a thicker gate oxide, may be used.

FIG. 4 shows an example of a typical wireless sensor node or embedded system to which the present technique can be applied. In this example the energy source 12 is a battery which provides a voltage of between 1.2 and 3.3 volts as the second voltage level VDD2. In this example two different first voltage domains 6 are provided with first voltages VDD1 of 1.0 V and 200-400 mV respectively using regulators 14. The regulators 14 in this example include a switching regulator and a linear regulator, but other types or numbers of regulators could also be provided.

The 200-400 mV domain in this example includes a CPU (processor) 40, memory units 42 including RAM (random access memory) or ROM (read only memory), bus logic 44, crypto accelerators 46, and timers or watchdogs 48. The 1.0 V domain includes a radio transmitter/receiver unit 50, a non-volatile memory 52 and a digital to analogue converter (DAC) or analogue to digital converter (ADC) 54. These are all examples of the circuitry 4 shown in FIG. 1. It will be appreciated that many other types of circuit could be provided. Each of these circuits 4 (40-54) may have power gates 20, 30 as shown in FIGS. 1 and 2. The control signal for these power gates is generated by a power management unit (PMU) which acts as control circuitry 24 in this example. The power management unit 24 has a real time clock (RTC) unit 56 for counting time. For example, the RTC 56 can be used to trigger the PMU 24 to periodically wake up the circuitry 4 from a power saving state to perform some task, before putting the circuitry 4 back to sleep. The PMU 24 and RTC 56 operate in the second voltage domain 8 which receives the unregulated voltage level VDD2 supplied by the battery 12, so that the control signals for the power gates in the circuitry 4 can be generated with a higher voltage to improve I-on/I-off for the transistors.

Hence, the device of FIG. 4 exploits the fact that the energy source for many wireless sensor nodes is expected to be a small coin cell battery or energy harvester which outputs a reasonably high voltage. The majority of the circuitry 4 in the first voltage domain 6 consumes significant dynamic energy when active, and so is usually run at a reduced voltage from the regulators 14 to extend battery lifetime to months or years. This reduced voltage is likely to be derived on-chip within the integrated circuit, to minimise size and cost as is typically desired for internet of things devices and wireless sensor nodes. The PMU 24 and RTC 56 are low-speed always-on blocks which consume a significant portion of the battery energy through leakage, as the activity ratio for the low voltage subsystem may be 0.1% or less, so this logic may be implemented entirely from ultra low leakage and highly voltage tolerant devices such as the thick gate oxide transistors mentioned above. The PMU 24 and RTC 56 are connected to the unregulated battery voltage as there is little dynamic power to be saved compared to the relatively high fixed cost of the regulators 14 plus low efficiencies under light load. That is, since most of the power consumed by the PMU 24 and RTC 56 is through leakage when inactive and the clock frequency for the PMU 24 and RTC 56 is several thousand times less than the clock frequency for the core domain 6, the additional cost of powering the PMU and RTC with the unregulated battery voltage is minimal.

Hence, it is recognised that the higher voltage supply VDD2 from the energy source 12 is pretty much always present for wireless sensor nodes and other small electronic devices, and so this can be reused for power gating "sleep" signal buffering. The PMU 24 decides which power domains, or which devices within each domain, should be on or off. The PMU may for example independently power on or off each circuit within the first domain 6, such as powering on the CPU but leaving the crypto accelerators 46 or timers 48 off, or powering up only some parts of RAM 42 while leaving other RAM modules inactive. Hence, the PMU drives the gating control signal for the required domains to switch them on and off, and this gating control signal is natively high voltage. This means no level shifting is required.

A schematic example of a floor plan for an integrated circuit using the present technique is shown in FIG. 5. In this example, the power gates 20 or 30 are distributed across the chip. The PMU 24 routes the gating control signal 22 to the power gates 20, 30 via buffers 60 which propagate the control signal across the chip. For example, the buffers may be inverters or non-inverting buffers. The buffers are used because otherwise the control signals 22 received at the power gates 20, 30 that are furthest from the PMU 24 would be very weak.

As shown in FIG. 6, a tree of buffers 60 may be implemented to route the control signal 22 from the control circuitry 24 to the power gates 20, 30. As shown in FIG. 6, to enable the buffer 60 to generate control signal at the second or third voltage level VDD2/VDD3, each buffer may also receive the second or third voltage level VDD2/VDD3 from the control circuitry 24 in addition to the control signal 22 (in conventional systems the buffers would be at the first voltage level VDD1 used by the circuitry 4). As the buffers 60 are driven by the higher voltage level, they may also be constructed from thick gate oxide transistors or other types of transistors which provide additional voltage tolerance to prevent damage to the buffers 60. FIG. 6 also shows that it is possible to stagger the switching of each power gate with respect to one another. If all the power gates were turned on or off at the same time then this may cause a large inrush current which can cause a drop in voltage levels within the circuitry 4 and could cause processing errors. The inrush current can be reduced by staggering the switching times of each power gate. As shown in the lower part of FIG. 6, this can be achieved by daisy chaining a number of buffers 60 so that the control signal 22 from the control circuitry 24 must pass different numbers of buffers 60 for different groups of power gates A, B. For example, in FIG. 6 the power gates A will switch states before power gates B because there is an additional buffer 60 between them. Similar staggered switching arrangements can be designed for larger trees for distributing the gating control signal 22 to the power gates.

While FIG. 5 shows an example where the power gating switches are distributed throughout the circuitry 4, they could also be ringed (around the edges of the circuitry). The usual argument for distributed switches is around minimizing IR drop from flip-chip bumps (which would have to be routed from above a block, out to the edges, down through vias to the switches, back up the metal stack and then gridded) but this is not a consideration for the devices we target with on-chip regulation. Nevertheless, distributing these switches is possible, as shown in the floorplan of FIG. 5. The footers in this case may require fairly large keepouts to prevent thin-thick oxide spacing violations. The high voltage buffers are fewer in number but may require even larger keepouts as they require a high-voltage "hot n-well" (assuming p-well is always on).

If a row-based approach is taken then these layout overheads can be mitigated, by dedicating the entire row to TGO devices and high-voltage n-well. The area tradeoff here depends on the power density and dimensions of each power domain. For example, the top/bottom rings used for CPU retention switches in the test chip were only about 10% utilized—the distributed approach (used for non-retention switches in the test chip) is clearly more optimal in this case.

A level-shifted version as shown in FIG. 2 with a further regulator 32 reducing VDD2 to VDD3 for the control circuitry 24 is possible, but less desirable because it doesn't benefit from the glitching savings when powering up the regulator and may incur more circuit area cost.

Also, as shown in FIG. 2, a header version is possible, however PMOS mobility is half that of NMOS in the technology nodes of interest and the high-voltage control in this case would put the header into super-cutoff (reducing I-off) rather than boosted gate (increasing I-on), so a lower threshold voltage device would be required to improve Ion and avoid frequency degradation. This might be a lower area solution however (no TGO keepouts, fewer number of switches for same Ion).

FIG. 7 shows another benefit of the present technique. Since the power gates 20, 30 and control circuitry 24 operate using a control signal generated in a different voltage domain 8 to the domain 6 including circuitry 4 and the voltage regulator 14, this means that the power gates can be properly disabled while the regulator powers up and down. This is not the case for normal sleep buffers as they would normally be connected to the low voltage regulated supply generated by the regulator 14. In conventional sleep buffers while the voltage regulator 14 is being turned on or off, there may be glitches as the power gates turn on or off. This glitching energy can be significant and is wasteful since glitches may cause energy loss even in the power domains which are not currently being turned on. For example, if we only want to use the CPU, RAM and ROM, but do not want to use the other power domains shown in FIG. 4, then known techniques may cause loss of energy when power rails connected to the other devices which were to stay inactive are charged because the power gates have glitched as the voltage regulator 14 turns on.

In contrast, in the present technique as shown in FIG. 7 the power gates may be turned off and then the control circuitry 24, 26 may switch the regulator 14 to a sleep mode in which it does not generate the first voltage level VDD1. When the regulator is returned to the active state then the power gates may remain off so that there are no glitches. Once the regulator is active then the power gates for the circuit elements that are to be powered are turned on, for example the CPU as shown in the middle plot of FIG. 7. The power gates for other elements of the device, such as the crypto accelerator in the example FIG. 7, may remain off so that these do not consume additional dynamic power. Hence, generating the control signal for the power gates in a separate voltage domain from the first voltage domain controlled by the regulator 14 has the added advantage of improving energy efficiency of powering on and off the voltage regulator 14. Therefore, the break-even time for shutting down the regulator 14 is reduced so that the regulator can be put to sleep for shorter periods, allowing the power saving mode of the regulator to be used more often to reduce power consumption.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An electronic device comprising:
   circuitry configured to operate in a first voltage domain supplied with a first voltage level and a reference voltage level;
   a voltage regulator configured to generate the first voltage level from a second voltage level higher than the first voltage level;
   at least one power gate configured to selectively couple the circuitry to one of the first voltage level generated by the voltage regulator and the reference voltage level; and
   control circuitry configured to generate a gating control signal for controlling whether the at least one power gate couples the circuitry to, or isolates the circuitry from, said one of the first voltage level and the reference voltage level;
   wherein the control circuitry is configured to operate in a second voltage domain supplied with a third voltage level derived from the second voltage level, wherein the third voltage level is higher than the first voltage level; and
   the at least one power gate has a gate terminal configured to receive the gating control signal generated by the control circuitry in the second voltage domain.

2. The electronic device according to claim 1, comprising an energy source configured to generate the second voltage level.

3. The electronic device according to claim 2, wherein the energy source is a local energy source provided within the electronic device.

4. The electronic device according to claim 2, wherein the energy source comprises at least one battery.

5. The electronic device according to claim 2, wherein the energy source comprises at least one energy harvester configured to harvest ambient energy.

6. The electronic device according to claim 1, wherein the at least one power gate comprises at least one footer transistor configured to selectively couple the circuitry to the reference voltage level.

7. The electronic device according to claim 1, wherein the at least one power gate comprises at least one header transistor configured to selectively couple the circuitry to the first voltage level.

8. The electronic device according to claim 1, wherein the at least one power gate comprises at least one transistor which is more voltage tolerant than transistors forming the circuitry.

9. The electronic device according to claim 8, wherein the at least one transistor has a thicker gate oxide than transistors forming the circuitry.

10. The electronic device according to claim 1, wherein the control circuitry comprises more voltage tolerant transistors than transistors forming the circuitry.

11. The electronic device according to claim 1, wherein the third voltage level is the same as the second voltage level.

12. The electronic device according to claim 1, wherein the third voltage level is less than the second voltage level.

13. The electronic device according to claim 12, comprising a further voltage regulator configured to generate the third voltage level from the second voltage level.

14. The electronic device according to claim 1, wherein the control circuitry is configured to control whether the voltage regulator is in an active state or a power saving state.

15. The electronic device according to claim 14, wherein when switching the voltage regulator between the power saving state and the active state, the control circuitry is configured to control the at least one power gate to remain in a state in which the circuitry is isolated from said one of the first voltage level and the reference voltage level.

16. The electronic device according to claim 1, comprising at least one buffer configured to propagate the gating control signal from the control circuitry to the at least one power gate.

17. The electronic device according to claim 16, wherein the at least one buffer is supplied with the third voltage level of the second voltage domain.

18. An electronic device comprising:
circuit means for operating in a first voltage domain supplied with a first voltage level and a reference voltage level;
voltage regulating means for generating the first voltage level from a second voltage level higher than the first voltage level;
at least one power gating means for selectively coupling the circuit means to one of the first voltage level generated by the voltage regulating means and the reference voltage level; and
control means for generating a gating control signal for controlling whether the at least one power gating means couples the circuit means to, or isolates the circuit means from, said one of the first voltage level and the reference voltage level;
wherein the control means is configured to operate in a second voltage domain supplied with a third voltage level derived from the second voltage level, wherein the third voltage level is higher than the first voltage level; and the at least one power gating means has a gate terminal means for receiving the gating control signal generated by the control means in the second voltage domain.

19. A power control method for an electronic device comprising circuitry configured to operate in a first voltage domain supplied with a first voltage level and a reference voltage level and at least one power gate configured to selectively couple the circuitry to one of the first voltage level and the reference voltage level; the method comprising:
generating the first voltage level from a second voltage level higher than the first voltage level using a voltage regulator;
generating a gating control signal for controlling whether the at least one power gate couples the circuitry to, or isolates the circuitry from, said one of the first voltage level and the reference voltage level, wherein the gating control signal is generated in a second voltage domain supplied with a third voltage level derived from the second voltage level, wherein the third voltage level is higher than the first voltage level; and
supplying the gating control signal to a gate terminal of the gating control signal.

20. A computer-implemented method of designing an integrated circuit layout for an electronic device, the method comprising using an automated design tool to generate data defining the integrated circuit layout, the integrated circuit layout comprising:
circuitry configured to operate in a first voltage domain supplied with a first voltage level and a reference voltage level;
a voltage regulator configured to generate the first voltage level from a second voltage level higher than the first voltage level;
at least one power gate configured to selectively couple the circuitry to one of the first voltage level generated by the voltage regulator and the reference voltage level; and
control circuitry configured to generate a gating control signal for controlling whether the at least one power gate couples the circuitry to, or isolates the circuitry from, said one of the first voltage level and the reference voltage level;
wherein the control circuitry is configured to operate in a second voltage domain supplied with a third voltage level derived from the second voltage level, wherein the third voltage level is higher than the first voltage level; and
the at least one power gate has a gate terminal configured to receive the gating control signal generated by the control circuitry in the second voltage domain.

* * * * *